US006475835B1

United States Patent
Hu et al.

(12) United States Patent
(10) Patent No.: US 6,475,835 B1
(45) Date of Patent: Nov. 5, 2002

(54) METHOD FOR FORMING THIN FILM TRANSISTOR

(75) Inventors: Guo-Ren Hu, Taipei (TW); Ying-Chia Chen, Taichung (TW); Chi-Wei Chao, Taipei (TW); Yew-Chung Wu, Taichung (TW); Yao-Lun Hsu, Taipei (TW); Yuan-Tung Dai, Tao-Yuan (TW); Wen-Tung Wang, Hsin-Chu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/084,329

(22) Filed: Feb. 28, 2002

(51) Int. Cl.$^7$ ................ H01L 21/84; H01L 27/148
(52) U.S. Cl. ................ 438/147; 438/151; 257/241
(58) Field of Search .................. 438/147, 149, 438/150, 163, 164, 155, 156, 158, 160; 257/241, 243, 224, 240, 344, 351–354

(56) References Cited

U.S. PATENT DOCUMENTS 4,965,648 A * 10/1990 Yang et al. .................. 257/58
6,297,080 B1 * 10/2001 Lee et al. .................. 438/151

* cited by examiner

Primary Examiner—Olik Chaudhuri
Assistant Examiner—(Vikki) Hoa B. Trinh
(74) Attorney, Agent, or Firm—Lowe Hauptman Gilman & Berner, LLP

(57) ABSTRACT

A method for forming a thin film transistor (TFT) is disclosed. The invention uses metal electroless plating or chemical displacement processes to form metal clusters adjacent the sidewall of amorphous silicon active region pattern so as to crystallize the amorphous silicon amid the subsequently performed metal induced lateral crystallization (MILC) process. The amorphous silicon is crystallized to form polysilicon having parallel grains. Since the amorphous silicon will crystallize with a specific angle which is measured between the grain orientation and the side wall of the amorphous silicon, a tilt channel connecting the source and drain region of the TFT is utilized to upgrade the electron mobility across the tilt channel, wherein the grain orientation of polysilicon in the tilt channel perpendicular to a gate electrode which is subsequently formed above the tilt channel.

20 Claims, 5 Drawing Sheets

METHOD FOR FORMING THIN FILM TRANSISTOR

BACKGROUND OF THE INVENTION

1. Field of the Invention

The present invention relates to a method of forming a thin film transistor, and more particularly to a method of forming a thin film transistor with a tilt channel of parallel needlelike polysilicon formed by electroless plating or chemical displacement metal induced crystallization.

2. Description of the Related Art

The demand for smaller electronic consumer products with higher resolution displays, spurs continued research and development in the area of liquid crystal displays (LCDs). The size of LCDs can be controlled by incorporating the large-scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield controllable LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/Vs$. Carrier mobility is improved by using crystallized silicon. Single crystal silicon transistors, which are usually used in TFT driver circuits, have electron mobilities on the order of 500 to 700 $cm^2/Vs$. Polycrystalline silicon transistor performance is between the two extremes, having mobilities on the order of 10 to 400 $cm^2/Vs$. Thin-film transistors having mobilities greater than 100 $cm^2/Vs$ would probably be useful in replacing LCD periphery mounted driver circuitry. However, it has been difficult to produce polycrystalline TFTs with electron mobilities of even 40 to 50 $cm^2/Vs$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600° C. for substantial lengths of time. Even the fabrication of polycrystalline silicon transistors has been very difficult due to the necessity of using low temperature crystalline processes when glass is involved.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a method of forming thin-film transistors with high electron mobility.

It is another object of this invention to provide a low-cost and simple method of forming thin-film transistors.

It is another object of this invention to provide a thin-film transistors with lower power consumption and faster transistor response times.

To achieve these objects, and in accordance with the purpose of the invention, the invention uses a method for forming a thin film transistor comprising the following steps. First of all, a substrate having an amorphous silicon layer thereon is provided. Secondly, the amorphous silicon is patterned to form an active region pattern having a source region pattern, a drain region pattern and a tilt channel pattern. Thirdly, a metal electroless plating or chemical displacement processes are performed over the active region pattern to form metal clusters adjacent the sidewall of the active region pattern. Finally, a metal induced lateral crystallization process is performed on the active region pattern to crystallize the active region pattern of amorphous silicon to form an active region of polysilicon having a source region, a drain region and a tilt channel, wherein the metal clusters adjacent the sidewall of the tilt channel pattern induce formations of parallel polysilicon grains and render the grain orientation of polysilicon in the tilt channel perpendicular to a gate electrode which is subsequently formed above the tilt channel.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
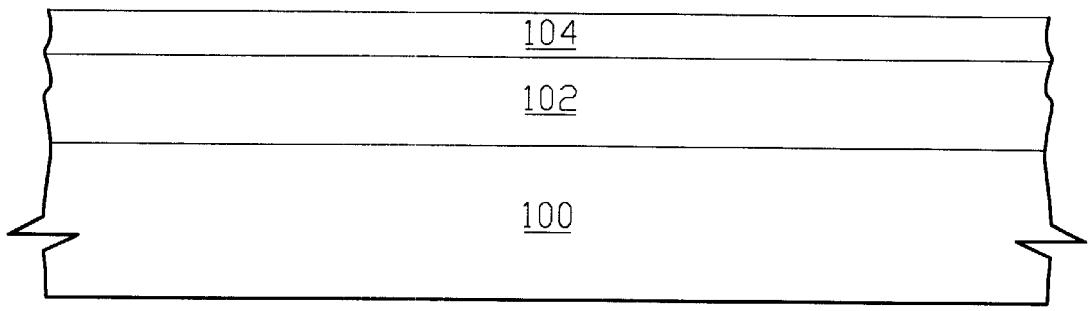
FIG. 1 shows a substrate 100 having a dielectric layer and an amorphous silicon layer.

Referring to FIG. 1, a substrate 100 having a dielectric layer 102 and an amorphous silicon layer 104 is shown. The substrate 100 can be a silicon wafer and the dielectric layer 102 is preferably an oxide layer formed by conventional methods. The substrate 100 can also be other insulating layer or transparent substrates such as quartz and glass. The amorphous silicon layer 104 can be formed by low-pressure chemical vapor deposition processes (LPCVD), or by plasma-enhanced chemical vapor deposition processes (PECVD).

Figure 2:
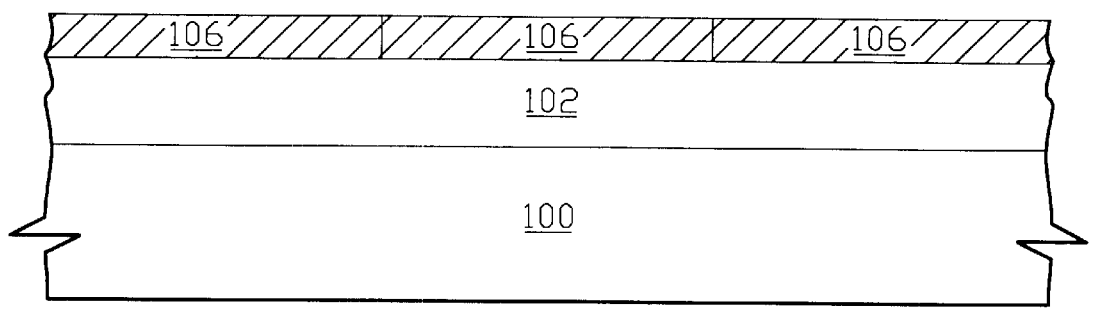
FIG. 2 shows the cross-section view of an active region formed by patterning the amorphous silicon layer shown in FIG. 1.
Figure 3:
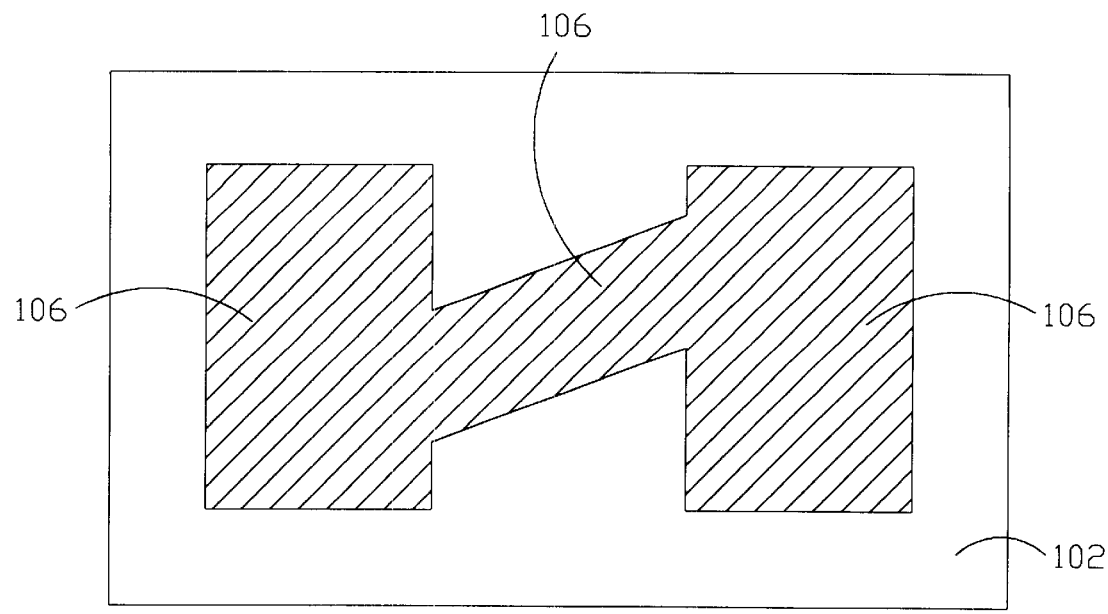
FIG. 3 shows the top view of the structure shown in FIG. 2.

Referring to FIG. 2 and 3, the amorphous silicon layer 104 is patterned to form an active region pattern 106 by using conventional photolithography and etching processes, wherein FIG. 2 shows the cross-section view of the active region pattern 106 and FIG. 3 shows the top view of the structure shown in FIG. 2. The active region pattern 106a comprises a source region pattern, a tilt channel pattern and a drain region pattern.

Figure 4:
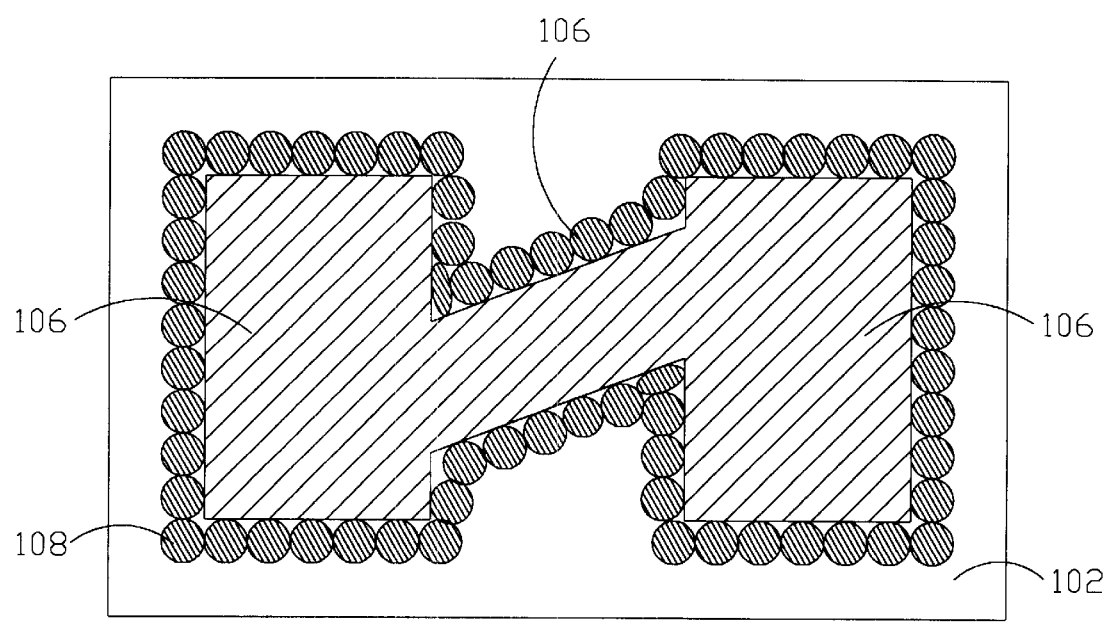
FIG. 4 shows a result of forming a plurality of metal clusters adjacent the sidewall of the active region by an electroless plating or chemical displacement processes.

Referring to FIG. 4, a plurality of metal clusters 108 are formed adjacent the sidewall of the active region pattern 106 by an electroless plating or chemical displacement processes. It is noted that the metal clusters formed on the top surface of the active region pattern 106 are omitted in FIG. 4 for simplicity. The metal cluster 108 can be palladium (Pd), nickel (Ni), platinum (Pt) and cobalt (Co), and is preferably palladium. The metal cluster 108 can be formed by using conventional electroless plating or chemical displacement processes.

One example of electroless plating Pd or chemical displacement Pd recipe includes 0.1 gram $PdCl_2$, 10 milliliters HCl and 990 milliliters $H_2O$. The electroless plating Pd or chemical displacement Pd processes utilizing the recipe set forth is preferably performed at about 80° C. The size or diameter of the metal cluster 108 is preferably about 50 to about 70 nm.

Figure 5:
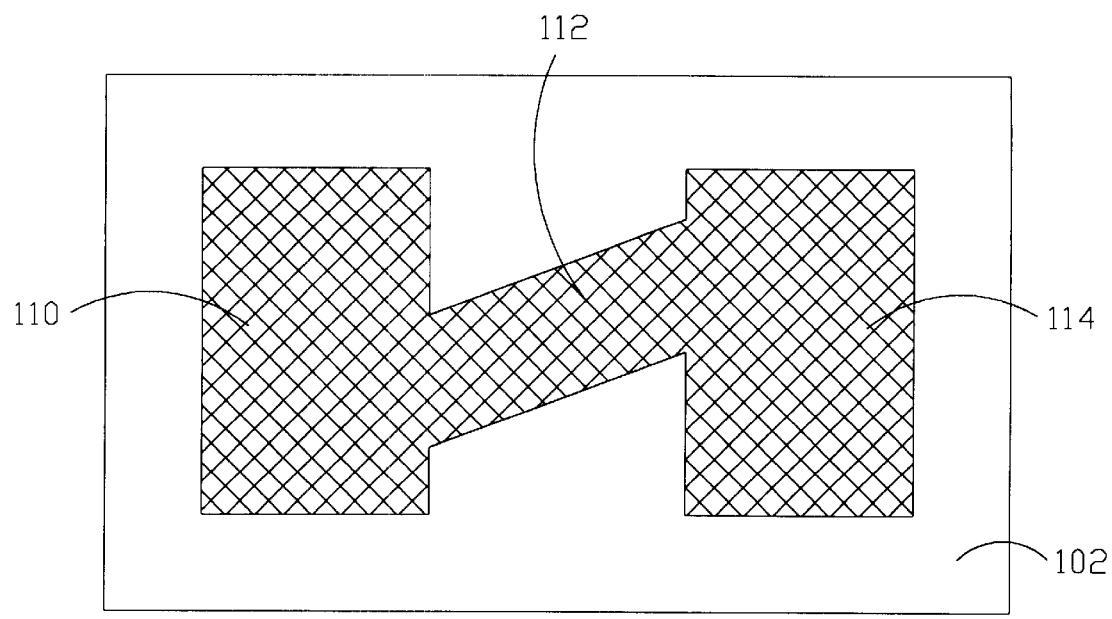
FIG. 5 shows a result of crystallizing amorphous silicon of the active region by a MILC method to form polysilicon of a source region, a tilt channel and a drain region.

Referring to FIG. 5, amorphous silicon of the active region pattern 106 is crystallized by a metal induced lateral crystallization method (MILC) to form polysilicon of a source region 110, a tilt channel 112 and a drain region 114. In the MILC process, amorphous silicon is exposed to heat from about 500° C. to about 600° C. for a period of at least 12 hours via an annealing process. The MILC process is preferably performed at about 550° C. for about 24 hours. Amorphous silicon crystallizes laterally from the sidewall of the active region pattern 106 to form polysilicon after the metal induced lateral crystallization process. Polysilicon formed by the MILC process set forth has parallel grains aligned with a specific angle. The angle is measured between the grain orientation and the sidewall of the active region pattern 106. The angle depends on metal used to induce the crystallization. The angle is about 55 degree for Pd. For Ni, the angle is about 70.5 degree.

Figure 6:
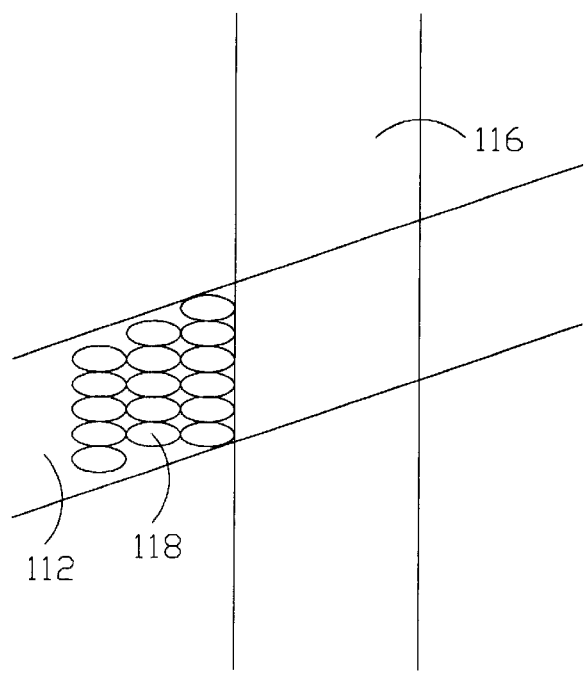
FIG. 6 shows a result of forming a gate electrode on the tilt channel.
Figure 7A:
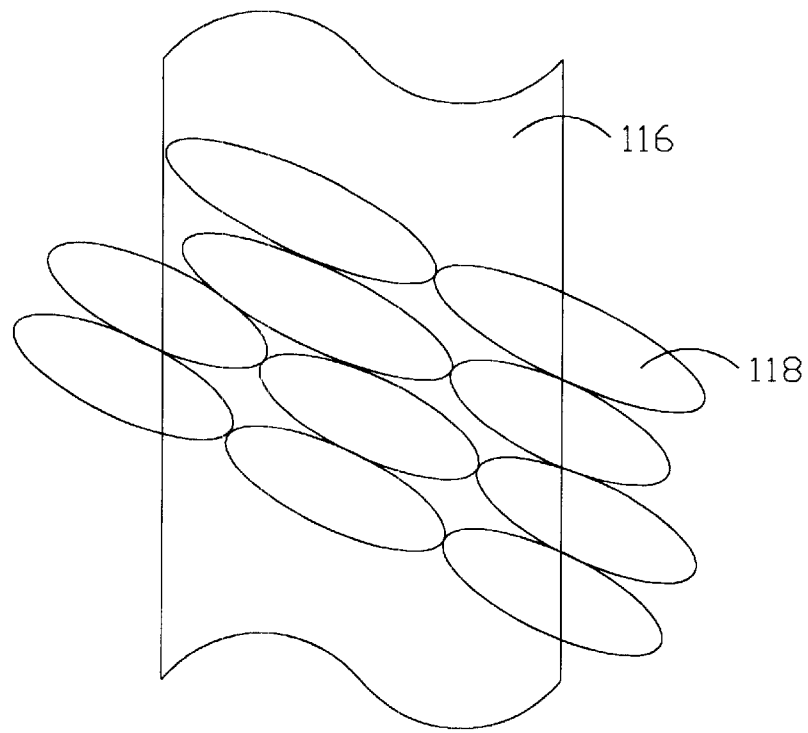
FIG. 7A shows a tilt grain orientation relative to the gate electrode of the TFT.
Figure 7B:
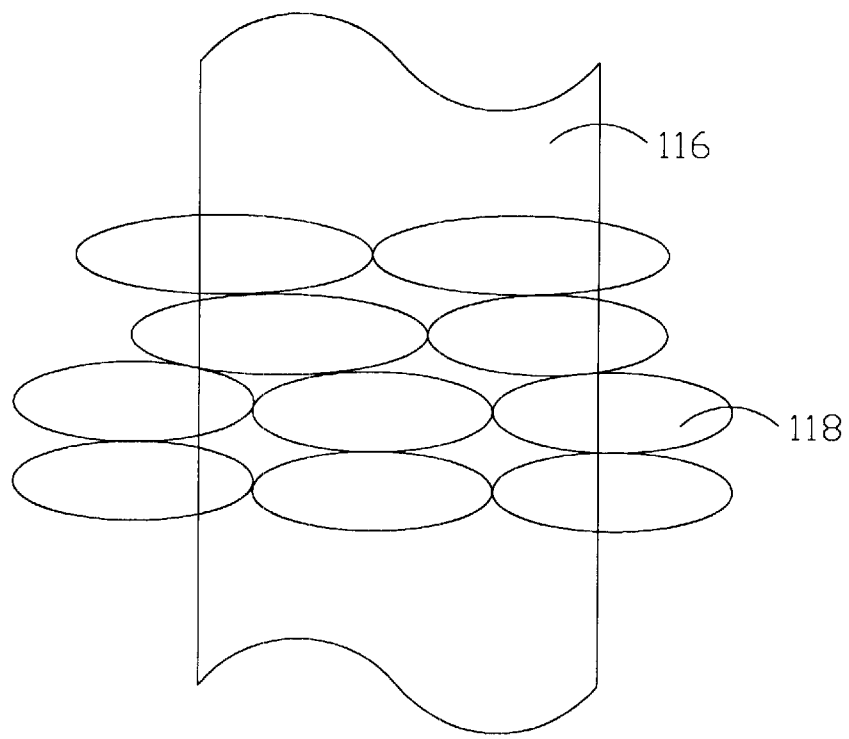
FIG. 7B shows a grain orientation perpendicular to the gate electrode of the TFT.

Referring to FIG. 6, a gate electrode 116 is formed on the tilt channel 112. A plurality of parallel grains 118 of the tilt channel 112 are also shown in this figure. The tilt channel 112 must tilts so as to render the grain orientation of the grains 118 perpendicular to the gate electrode 116 so that the electron mobility of the tilt channel 112 across the gate electrode 116 can be upgraded since electrons will meet less barriers or obstacles while the electrons move across the tilt channel 112 under the gate electrode 116. Comparing FIG. 7A and FIG. 7B, it is apparently that the electrons will meet much less barriers or grain boundaries while the electrons move across the tilt channel 112 under the gate electrode 116 in FIG. 7B.

Figure 8:
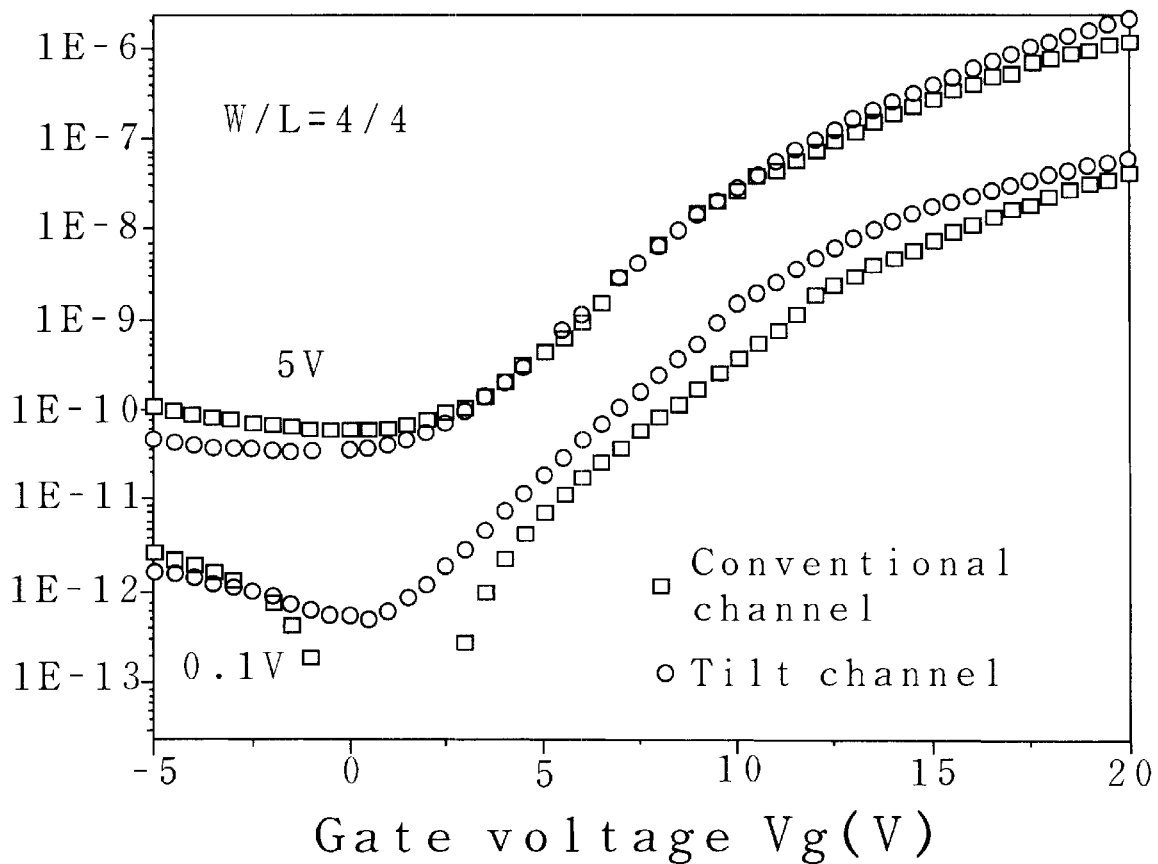
FIG. 8 shows the I–V curves of TFTs fabricated in accordance with the present invention and the conventional methods respectively.

FIG. 8 shows the I–V curves of TFTs fabricated in accordance with the present invention and the conventional methods respectively. As shown in FIG. 8, the TFT with a tilt channel of this invention has superior electrical properties. It is apparently that the drain current can be increased under the same gate voltage while a tilt channel is utilized.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming a thin film transistor, said method comprising:

providing a substrate;

forming an amorphous silicon on said substrate;

patterning said amorphous silicon to form an active region pattern having a source region pattern, a drain region pattern and a tilt channel pattern;

performing a metal electroless plating process over said active region pattern to form metal clusters adjacent the sidewall of said active region pattern; and performing a metal induced lateral crystallization process on said active region pattern to crystallize said active region pattern of amorphous silicon to form an active region of polysilicon having a source region, a drain region and a tilt channel, wherein said metal clusters adjacent the sidewall of said tilt channel pattern induce formations of parallel polysilicon grains and render the grain orientation of polysilicon in said tilt channel perpendicular to a gate electrode which is subsequently formed above said tilt channel.

2. The method according to claim 1, wherein said substrate comprises a silicon wafer having an oxide layer thereon.

3. The method according to claim 1, wherein said substrate comprises a glass substrate.

4. The method according to claim 1, wherein said metal electroless plating process comprises palladium electroless plating process.

5. The method according to claim 4, wherein the recipe of said palladium electroless plating process comprises 0.1 gram $PdCl_2$, 10 milliliters HCl and 990 milliliters $H_2O$.

6. The method according to claim 1, wherein said metal electroless plating process comprises nickel electroless plating process.

7. The method according to claim 1, wherein said metal electroless plating process comprises platinum electroless plating process.

8. The method according to claim 1, wherein said metal electroless plating process comprises cobalt electroless plating process.

9. The method according to claim 1, wherein the diameter of said metal cluster is from about 50 nm to about 70 nm.

10. The method according to claim 1, wherein said metal induced lateral crystallization process is performed at a temperature from about 500° C. to about 600° C.

11. The method according to claim 1, wherein said temperature is preferably about 550° C.

12. A method for forming a thin film transistor, said method comprising:

providing a substrate;

forming an amorphous silicon on said substrate;

patterning said amorphous silicon to form an active region pattern having a source region pattern, a drain region pattern and a tilt channel pattern;

performing a chemical displacement palladium electroless plating process over said active region pattern to form palladium clusters adjacent the sidewall of said active region pattern; and performing a metal induced lateral crystallization process on said active region pattern to crystallize said active region pattern of amorphous silicon to form an active region of polysilicon having a source region, a drain region and a tilt channel, wherein said palladium clusters adjacent the sidewall of said tilt channel pattern induce formations of parallel polysilicon grains and render the grain orientation of polysilicon in said tilt channel perpendicular to a gate electrode which is subsequently formed above said tilt channel.

13. The method according to claim 12, wherein said chemical displacement palladium process is performed at about 80° C.

14. The method according to claim 12, wherein said metal induced lateral crystallization process is performed for at least about 12 hours.

15. The method according to claim 12, wherein said metal induced lateral crystallization process is preferably performed for about 24 hours.

16. The method according to claim 12, wherein the angle between the grain orientation of polysilicon in said tilt channel and the sidewall of said tilt channel is about 55 degree.

17. A method for forming a thin film transistor, said method comprising:

providing a substrate having an amorphous silicon thereon;

patterning said amorphous silicon to form an active region pattern having a source region pattern, a drain region pattern and a tilt channel pattern;

performing a metal electroless plating process over said active region pattern to form metal clusters adjacent the sidewall of said active region pattern; and performing a metal induced lateral crystallization process on said active region pattern for at least about 12 hours to crystallize said active region pattern of amorphous silicon to form an active region of polysilicon having a source region, a drain region and a tilt channel, wherein said metal clusters adjacent the sidewall of said tilt channel pattern induce formations of parallel polysilicon grains and render the grain orientation of polysilicon in said tilt channel perpendicular to a gate electrode which is subsequently formed above said tilt channel.

18. The method according to claim 17, wherein said metal electroless plating process comprises palladium electroless plating process.

19. The method according to claim 17, wherein said metal electroless plating process comprises nickel electroless plating process.

20. The method according to claim 17, wherein the diameter of said metal cluster is from about 50 nm to about 70 nm.

* * * * *